US010626009B2

United States Patent
Keal

(10) Patent No.: US 10,626,009 B2
(45) Date of Patent: *Apr. 21, 2020

(54) INFERRING AMBIENT ATMOSPHERIC TEMPERATURE

(71) Applicant: InvenSense, Inc., San Jose, CA (US)

(72) Inventor: William Kerry Keal, Santa Clara, CA (US)

(73) Assignee: InvenSense, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/362,727

(22) Filed: Mar. 25, 2019

(65) Prior Publication Data

US 2019/0293499 A1   Sep. 26, 2019

Related U.S. Application Data

(63) Continuation of application No. 15/650,812, filed on Jul. 14, 2017, now Pat. No. 10,239,750.

(Continued)

(51) Int. Cl.

| | |
|---|---|
| *B81C 1/00* | (2006.01) |
| *G01C 19/5719* | (2012.01) |
| *G01P 1/02* | (2006.01) |
| *G01P 15/08* | (2006.01) |
| *G01P 15/125* | (2006.01) |

(Continued)

(52) U.S. Cl.
CPC ........ *B81C 1/0023* (2013.01); *G01C 19/5719* (2013.01); *G01K 11/24* (2013.01); *G01K 15/005* (2013.01); *G01P 1/023* (2013.01); *G01P 15/0802* (2013.01); *G01P 15/125* (2013.01); *G01P 15/18* (2013.01); *H01H 59/0009* (2013.01); *H03H 9/1057* (2013.01); *H04R 1/08* (2013.01); *B81B 2201/0235* (2013.01); *B81B 2201/042* (2013.01); *B81C 2201/019* (2013.01);

(Continued)

(58) Field of Classification Search
CPC .......... B81C 1/0023; B81C 2203/0118; G01C 19/5719; G01P 1/023; G01P 15/0802; G01P 15/125; G01P 15/18; G01P 2015/0831; H01H 59/0009; H03H 9/1057; B81B 2201/0235; B81B 2201/042; B81B 2201/019
USPC ....................................................... 381/304
See application file for complete search history.

(56) References Cited

U.S. PATENT DOCUMENTS

| | | | | |
|---|---|---|---|---|
| 5,918,281 A | * | 6/1999 | Nabulsi | G01F 1/10 73/597 |
| 6,439,468 B1 | * | 8/2002 | Lambert | B60H 1/00735 236/49.3 |

(Continued)

*Primary Examiner* — William A Jerez Lora

(57) ABSTRACT

In a method of inferring ambient atmospheric temperature, an acoustic signal is emitted from a speaker. A first sample of the acoustic signal is captured with a first microphone spaced a first distance from the speaker. A second sample of the acoustic signal is captured with a second microphone spaced a second distance from the speaker. The second distance is greater than the first distance, and a difference between the first distance and the second distance is a known third distance. A time delay in the acoustic signal is determined between the first sample and the second sample. An ambient temperature of the atmosphere through which the acoustic signal traveled is inferred based on a relationship between the time delay and temperature for the acoustic signal over the third distance.

27 Claims, 8 Drawing Sheets

Related U.S. Application Data

(60) Provisional application No. 62/476,924, filed on Mar. 27, 2017.

(51) Int. Cl.
*G01P 15/18* (2013.01)
*H01H 59/00* (2006.01)
*H03H 9/10* (2006.01)
*G01K 11/24* (2006.01)
*G01K 15/00* (2006.01)
*H04R 1/08* (2006.01)

(52) U.S. Cl.
CPC ............... *B81C 2203/0118* (2013.01); *G01P 2015/0831* (2013.01)

(56) References Cited

U.S. PATENT DOCUMENTS

| | | | |
|---|---|---|---|
| 7,104,129 B2 | 9/2006 | Nasiri et al. | |
| 8,952,832 B2 | 2/2015 | Nasiri et al. | |
| 2006/0099940 A1* | 5/2006 | Pfleging | H04M 3/42 455/419 |
| 2009/0251208 A1* | 10/2009 | Lee | H04B 1/71637 329/313 |
| 2009/0271187 A1* | 10/2009 | Yen | G10L 21/0208 704/226 |
| 2011/0137585 A1* | 6/2011 | McGill, Sr. | G01N 29/075 702/56 |
| 2012/0015697 A1* | 1/2012 | Spencer | H04M 1/605 455/569.1 |
| 2014/0241552 A1* | 8/2014 | Takeda | H04R 5/02 381/307 |
| 2015/0046102 A1* | 2/2015 | McGill, Sr. | G01F 1/667 702/48 |
| 2015/0092971 A1* | 4/2015 | Kim | H04R 25/558 381/328 |
| 2016/0066266 A1* | 3/2016 | Law | H04W 52/027 455/574 |
| 2016/0284333 A1* | 9/2016 | Weston | G10K 11/178 |
| 2018/0273374 A1 | 9/2018 | Keal | |

* cited by examiner

INFERRING AMBIENT ATMOSPHERIC TEMPERATURE

CROSS-REFERENCE TO RELATED APPLICATION—CONTINUATION

This application is a continuation of and claims priority to and benefit of co-pending U.S. patent application Ser. No. 15/650,812 filed on Jul. 14, 2017 entitled "INFERRING AMBIENT ATMOSPHERIC TEMPERATURE" by William Kerry Keal, and assigned to the assignee of the present application, the disclosure of which is hereby incorporated herein by reference in its entirety.

Application Ser. No. 15/650,812 claims priority to and benefit of the then U.S. Provisional Patent Application No. 62/476,924 filed on Mar. 27, 2017 entitled "Solving Velocity Using Microphones," by William Kerry Keal, and assigned to the assignee of the present application, the disclosure of which is hereby incorporated herein by reference in its entirety.

BACKGROUND

Advances in technology have enabled the introduction of electronic devices that feature an ever increasing set of capabilities. Smartphones, for example, now offer sophisticated computing and sensing resources together with expanded communication capability, digital imaging capability, and user experience capability. Likewise, tablets, wearables, media players, Internet connected devices (which may or may not be mobile), and other similar electronic devices have shared in this progress and often offer some or all of these capabilities. Many of the capabilities of electronic devices, and in particular mobile electronic devices, are enabled by sensors (e.g., accelerometers, gyroscopes, pressure sensors, thermometers, acoustic sensors, etc.) that are included in the electronic device. That is, one or more aspects of the capabilities offered by electronic devices will rely upon information provided by one or more of the sensors of the electronic device in order to provide or enhance the capability. In general, sensors detect or measure physical or environmental properties of the device or its surroundings, such as one or more of the orientation, velocity, and acceleration of the device, and/or one or more of the temperature, acoustic environment, atmospheric pressure, etc. of the device and/or its surroundings, among others.

BRIEF DESCRIPTION OF DRAWINGS

The accompanying drawings, which are incorporated in and form a part of the Description of Embodiments, illustrate various embodiments of the subject matter and, together with the Description of Embodiments, serve to explain principles of the subject matter discussed below. Unless specifically noted, the drawings referred to in this Brief Description of Drawings should be understood as not being drawn to scale. Herein, like items are labeled with like item numbers.

DESCRIPTION OF EMBODIMENTS

Figure 1A:
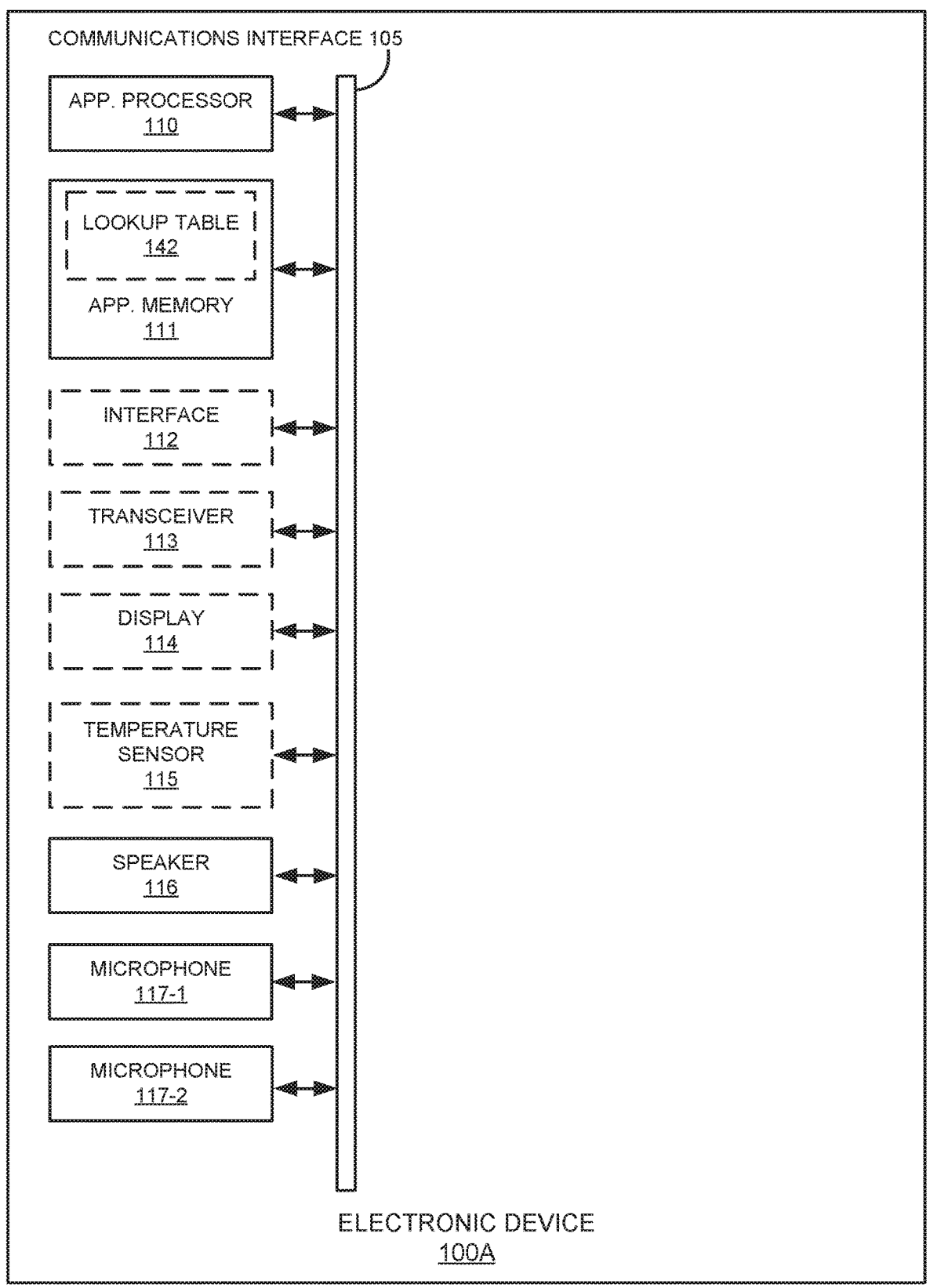
FIG. 1A shows a block diagram of an example electronic device, in accordance with various aspects of the present disclosure.

Reference will now be made in detail to various embodiments of the subject matter, examples of which are illustrated in the accompanying drawings. While various embodiments are discussed herein, it will be understood that they are not intended to limit to these embodiments. On the contrary, the presented embodiments are intended to cover alternatives, modifications and equivalents, which may be included within the spirit and scope the various embodiments as defined by the appended claims. Furthermore, in this Description of Embodiments, numerous specific details are set forth in order to provide a thorough understanding of embodiments of the present subject matter. However, embodiments may be practiced without these specific details. In other instances, well known methods, procedures, components, and circuits have not been described in detail as not to unnecessarily obscure aspects of the described embodiments.

Overview of Discussion

The speed of sound depends on the ambient temperature of the air though which the sound waves travel, and thus by determining the speed of sound the ambient atmospheric temperature may be determined. Herein, "atmospheric" generally refers to an atmosphere of breathable air, but the techniques discussed herein may be implemented in other gaseous atmospheres. Conventionally, a single speaker and a single microphone may be used to determine ambient atmospheric temperature. The single speaker/single microphone temperature measuring procedure involves measuring the time-of-flight between the loudspeaker and the microphone. However, this single microphone/single speaker technique can present difficult timing requirements to estimate time-of-flight between the microphone and loudspeaker as the transmit time and receipt time have to be well coordinated and calibrated. The techniques described herein instead measure flight difference between an emitted acoustic signal reaching two or more microphones each spaced a different distance from an emission point of the acoustic signal. By comparing the difference in the signal at each of the two or more microphones, the need to know the start of transit time from the emission source (e.g., a loudspeaker) is eliminated as is the need to tightly correlate the timing of the emission and receipt of the acoustic signal. This also removes the need to determine the time-of-flight between the loudspeaker and either microphone and the need for accurate timing on the operation of the loudspeaker that emits the acoustic signal.

Embodiments described herein provide new capabilities and functionality and increase the usability of electronic devices. Ambient temperature is the temperature in the surrounding environment. For example, using components and techniques described herein, an electronic device can emit (e.g., with a speaker) one or more acoustic signals, receive the acoustic signal(s) with two or more microphones each spaced a different distance from the source of emission and use a difference in the received signals such as a phase difference or time-of-flight difference to infer the ambient temperature of the environment immediately surrounding the electronic device through which the acoustic signal travelled between emission and receipt. By performing calculations where the frequency of each of the one or more acoustic signals is known and the distances between each microphone and the speaker (and thus the delta between any two microphones) are known, the temperature can be inferred from based on, for example, how much longer it takes a signal to reach a second microphone after it reached a first microphone. These calculations can be performed on-the-fly for each difference measurement and/or temperatures associated with different time-of-flight differences for one or more pairs of microphones and/or can be pre-calculated and stored in memory, such as in a lookup table.

Discussion begins with a description of notation and nomenclature. Discussion continues with description of an example electronic device, which may be a mobile electronic device. An embodiment, of the electronic device which includes a sensor processing unit having a sensor processor, memory, at least one speaker and at least two microphones is then described. An example electronic device being used to acoustically infer ambient atmospheric temperature is then illustrated and described. Several graphs are then described to illustrate the relationship between an acoustic signal and separated microphones at a particular frequency of an acoustic signal. Finally, operation of the electronic device and components thereof are then further described in conjunction with description of an example method of inferring ambient atmospheric temperature.

Notation and Nomenclature

Some portions of the detailed descriptions which follow are presented in terms of procedures, logic blocks, processing and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be one or more self-consistent procedures or instructions leading to a desired result. The procedures are those requiring physical manipulations of physical quantities. Usually, although not necessarily, these quantities take the form of electrical or magnetic signals capable of being stored, transferred, combined, compared, and otherwise manipulated in an electronic device/component.

It should be borne in mind, however, that all of these and similar terms are to be associated with the appropriate physical quantities and are merely convenient labels applied to these quantities. Unless specifically stated otherwise as apparent from the following discussions, it is appreciated that throughout the description of embodiments, discussions utilizing terms such as "emitting," "capturing," "determining," "inferring," "achieving," "filtering," "accessing," "accomplishing," "providing," "operating," "storing," or the like, refer to the actions and processes of an electronic device or component such as: a sensor processing unit (SPU), a processor of a sensor processing unit, a host processor of an electronic device, a memory/buffer, or the like, or a combination thereof. The electronic device/component manipulates and transforms data represented as physical (electronic and/or magnetic) quantities within the registers and memories into other data similarly represented as physical quantities within memories or registers or other such information storage, transmission, processing, or display components.

Embodiments described herein may be discussed in the general context of processor-executable instructions residing on some form of non-transitory processor-readable medium, such as program modules or logic, executed by one or more computers, processors, or other devices. Generally, program modules include routines, programs, objects, components, data structures, etc., that perform particular tasks or implement particular abstract data types. The functionality of the program modules may be combined or distributed as desired in various embodiments.

In the figures, a single block may be described as performing a function or functions; however, in actual practice, the function or functions performed by that block may be performed in a single component or across multiple components, and/or may be performed using hardware, using software, or using a combination of hardware and software. To clearly illustrate this interchangeability of hardware and software, various illustrative components, blocks, modules, circuits, and steps have been described generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure. Also, the example electronic device(s) described herein may include components other than those shown, including well-known components.

The techniques described herein may be implemented in hardware, or a combination of hardware with firmware and/or software, unless specifically described as being implemented in a specific manner. Any features described as modules or components may also be implemented together in an integrated logic device or separately as discrete but interoperable logic devices. If implemented in software, the techniques may be realized at least in part by a non-transitory processor-readable storage medium comprising instructions that, when executed, cause a processor and/or other components to perform one or more of the methods described herein. The non-transitory processor-readable data storage medium may form part of a computer program product, which may include packaging materials.

The non-transitory processor-readable storage medium may comprise random access memory (RAM) such as synchronous dynamic random access memory (SDRAM), read only memory (ROM), non-volatile random access memory (NVRAM), electrically erasable programmable read-only memory (EEPROM), FLASH memory, other known storage media, and the like. The techniques additionally, or alternatively, may be realized at least in part by a processor-readable communication medium that carries or communicates code in the form of instructions or data structures and that can be accessed, read, and/or executed by a computer or other processor.

The various illustrative logical blocks, modules, circuits and instructions described in connection with the embodiments disclosed herein may be executed by one or more processors, such as one or more sensor processing unit (SPU), host processor(s) or core(s) thereof, digital signal processors (DSPs), general purpose microprocessors, application specific integrated circuits (ASICs), application specific instruction set processors (ASIPs), field programmable gate arrays (FPGAs), or other equivalent integrated or discrete logic circuitry. The term "processor," as used herein may refer to any of the foregoing structures or any other structure suitable for implementation of the techniques described herein. In addition, in some aspects, the functionality described herein may be provided within dedicated software modules or hardware modules configured as described herein. Also, the techniques could be fully implemented in one or more circuits or logic elements. A general purpose processor may be a microprocessor, but in the alternative, the processor may be any conventional processor, controller, microcontroller, or state machine. A processor may also be implemented as a combination of computing devices, e.g., a combination of a SPU and a microprocessor, a plurality of microprocessors, one or more microprocessors in conjunction with a core of a SPU, or any other such configuration.

In various example embodiments discussed herein, a chip is defined to include at least one substrate typically formed from a semiconductor material. A single chip may for example be formed from multiple substrates, where the substrates are mechanically bonded to preserve the functionality. Multiple chip (or multi-chip) includes at least two substrates, wherein the two substrates are electrically connected, but do not require mechanical bonding.

A package provides electrical connection between the bond pads on the chip (or for example a multi-chip module) to a metal lead that can be soldered to a printed circuit board (or PCB). A package typically comprises a substrate and a cover. An Integrated Circuit (IC) substrate may refer to a silicon substrate with electrical circuits, typically CMOS circuits. A MEMS substrate provides mechanical support for the MEMS structure(s). The MEMS structural layer is attached to the MEMS substrate. The MEMS substrate is also referred to as handle substrate or handle wafer. In some embodiments, the handle substrate serves as a cap to the MEMS structure.

In the described embodiments, an electronic device incorporating a sensor may, for example, employ a sensor processing unit (SPU) that includes at least one sensor in addition to electronic circuits. The at least one sensor may comprise any of a variety of sensors, such as for example a gyroscope, a magnetometer, an accelerometer, a microphone, a pressure sensor, a proximity sensor, a moisture sensor, a temperature sensor, a biometric sensor, or an ambient light sensor, among others known in the art. The SPU may include at least one acoustic emitter (e.g., a speaker) in addition to the at least one sensor. The SPU may include more than one of a single type of sensor, such as including two, three, four, or some other number of microphones. In some embodiments, all of the SPU may be embodied in a single integral package while in other embodiments some components may distributed across more than one package.

In some embodiments, the SPU may comprise one or more motion sensors. For example, an embodiment with an accelerometer, a gyroscope, and a magnetometer or other compass technology, which each provide a measurement along three axes that are orthogonal relative to each other, may be referred to as a 9-axis device. Other embodiments may, for example, comprise an accelerometer, gyroscope, compass, and pressure sensor, and may be referred to as a 10-axis device. Along with one or more motion sensors, some embodiments of the SPU may include two or more microphones in an SPU which is either distributed across several packages or consolidated into a single package. Other embodiments may not include all the sensors or may provide measurements along one or more axes.

The sensors may, for example, be formed on a first substrate. Various embodiments may, for example, include solid-state sensors and/or any other type of sensors. The electronic circuits in the SPU may, for example, receive measurement outputs from the one or more sensors. In various embodiments, the electronic circuits process the sensor data. The electronic circuits may, for example, be implemented on a second silicon substrate. In some embodiments, the first substrate may be vertically stacked, attached and electrically connected to the second substrate in a single semiconductor chip, while in other embodiments, the first substrate may be disposed laterally and electrically connected to the second substrate in a single semiconductor package, such as a single integrated circuit.

In an example embodiment, the first substrate is attached to the second substrate through wafer bonding, as described in commonly owned U.S. Pat. No. 7,104,129, to simultaneously provide electrical connections and hermetically seal the MEMS devices. This fabrication technique advantageously enables technology that allows for the design and manufacture of high performance, multi-axis, inertial sensors in a very small and economical package. Integration at the wafer-level minimizes parasitic capacitances, allowing for improved signal-to-noise relative to a discrete solution. Such integration at the wafer-level also enables the incorporation of a rich feature set which minimizes the need for external amplification.

Example Electronic Device

Turning to the figures, FIG. 1A shows a block diagram of an example electronic device 100A, in accordance with various aspects of the present disclosure.

As will be appreciated, electronic device 100A may be implemented as a mobile electronic device or apparatus. By mobile, what is meant is that the electronic device is a handheld and/or wearable device (e.g., a watch, a headband, a pendant, an armband, a belt-mounted device, eyeglasses, a fitness device, a health monitoring device, etc.) that can be held in the hand of a user and/or worn on the person For example, such a mobile electronic device 100A may without limitation be: a mobile phone (e.g., a cellular phone, a phone running on a local network, or any other telephone handset), wired telephone (e.g., a phone attached by a wire and/or optical tether), personal digital assistant (PDA), pedometer, personal activity and/or health monitoring device, video game player, video game controller, navigation device, mobile internet device (MID), personal navigation device (PND), digital still camera, digital video camera, a tablet computer, a head mounted display (HMD), a virtual reality of augmented reality display, a notebook computer, binoculars, telephoto lens, portable music, video, or media player, remote control, or other handheld device, a wristwatch, a mobile internet of things (JOT) device, or a combination of one or more of these devices.

In some embodiments, electronic device 100A may be a self-contained device that comprises its own display and/or other output devices in addition to input devices as described below. However, in other embodiments, electronic device 100A may function in conjunction with another portable device or a non-portable device such as a desktop computer, electronic tabletop device, server computer, etc., which can communicate with electronic device 100A, e.g., via network connections. Electronic device 100A may, for example, be capable of communicating via a wired connection using any type of wire-based communication protocol (e.g., serial transmissions, parallel transmissions, packet-based data communications), wireless connection (e.g., electromagnetic radiation, infrared radiation or other wireless technology), or a combination of one or more wired connections and one or more wireless connections.

As shown, example electronic device 100A comprises a communications interface 105, an application (or host) processor 110, application (or host) memory 111, at least one speaker 116, and at least two microphones 117 (e.g., microphone 117-1 and microphone 117-2). With respect to FIG. 1A all of the illustrated components (when included) are part of the host system. In FIG. 1A, components showed in broken line (i.e., dashed boxes) may not be included in some embodiments. Accordingly, in some embodiments, electronic device 100A may additionally include one or some combination of: interface 112, transceiver 113, display 114, temperature sensor 115. As depicted in FIG. 1, included components are communicatively coupled with one another, such as, via communications interface 105.

The application processor 110 (also referred to herein as "host processor" 110) may, for example, be configured to perform the various computations and operations involved with the general function of electronic device 100A (e.g., running applications, performing operating system functions, performing power management functionality, controlling user interface functionality for electronic device 100A, etc.). Application processor 110 can be one or more microprocessors, central processing units (CPUs), DSPs, general purpose microprocessors, ASICs, ASIPs, FPGAs or other processors which run software programs or applications, which may be stored in application memory 111, associated with the functions and capabilities of electronic device 100A. In some embodiments, processor 110 operates to perform calculations which correlate time delays and/or phase-shifts between receipt of acoustic signals at various microphone pairs (e.g., 117-1 and 117-2; and/or or other pair(s)) with ambient temperature values.

Communications interface 105 may be any suitable bus or interface, such as a peripheral component interconnect express (PCIe) bus, a universal serial bus (USB), a universal asynchronous receiver/transmitter (UART) serial bus, a suitable advanced microcontroller bus architecture (AMBA) interface, an Inter-Integrated Circuit (I2C) bus, a serial digital input output (SDIO) bus, or other equivalent.

The application memory 111 (for example, a host memory) may comprise programs, drivers or other data that utilize information provided by the SPU 120. Details regarding example suitable configurations of the application (or host) processor 110 and SPU 120 may be found in commonly owned U.S. patent application Ser. No. 12/106,921, filed Apr. 21, 2008. Application memory 111 can be any suitable type of memory, including but not limited to electronic memory (e.g., read only memory (ROM), random access memory (RAM), or other electronic memory), hard disk, optical disk, or some combination thereof. Multiple layers of software can be stored in application memory 111 for use with/operation upon application processor 110. In some embodiments, a portion of application memory 111 may be utilized as a buffer for data from one or more of the components of electronic device 100A. In some embodiments, application memory 111 may store data, for example, in the form of a lookup table 142, that includes stored data that correlates time delays, phase-shifts, or other measurements between receipt of acoustic signals at various microphone pairs (e.g., 117-1 and 117-2 and/or others) with ambient temperature values which cause the particular time delays.

Interface 112, when included, may be any of a variety of different devices providing input and/or output to a user, such as audio speakers, touch screen, real or virtual buttons, joystick, slider, knob, printer, scanner, computer network I/O device, other connected peripherals and the like.

Transceiver 113, when included, may be one or more of a wired or wireless transceiver which facilitates receipt of data at electronic device 100A from an external transmission source and transmission of data from electronic device 100A to an external recipient. By way of example, and not of limitation, in various embodiments, transceiver 113 comprises one or more of: a cellular transceiver, a wireless local area network transceiver (e.g., a transceiver compliant with one or more Institute of Electrical and Electronics Engineers (IEEE) 802.11 specifications for wireless local area network communication), a wireless personal area network transceiver (e.g., a transceiver compliant with one or more IEEE 802.15 specifications for wireless personal area network communication), and a wired a serial transceiver (e.g., a universal serial bus for wired communication).

Display 114, when included, may be a liquid crystal device, (organic) light emitting diode device, or other display device suitable for creating and visibly depicting graphic images and/or alphanumeric characters recognizable to a user. Display 114 may be configured to output images viewable by the user and may additionally or alternatively function as a viewfinder for camera unit of the electronic device.

Temperature sensor 115, when included, is a non-acoustic means of measuring ambient atmospheric temperature of the environment of temperature sensor 115. That is, temperature sensor 115 does not utilize sound in the determination of temperature. Temperature sensor 115, may comprise, without limitation: a solid state electrical temperature sensor, or an electromechanical temperature sensor. In some embodiments, acoustical inference of ambient atmospheric temperature is only performed when a reading from temperature sensor 115 is within a defined range. One example of such a defined range is between 0 and 50 degrees Celsius. Other ranges are possible such as, for example, −20 degrees Celsius to 70 degrees Celsius. In some instances, an electronic device 100 may rely on acoustic inference of ambient temperature, as described herein, rather than other methods when other methods provide measurements that are below a certain threshold temperature (such as below 5 degrees Celsius) and/or are above a certain threshold (such as 35 degrees Celsius). Other thresholds are possible. Alternatively, in some embodiments, temperature determination may be preferred through acoustic inference because temperature sensor 115 may give unreliable results, e.g., due to excess internal heat generation.

A speaker 116, when included, may be any type of speaker which converts an electrical audio signal into a corresponding emitted acoustic signal (i.e., a sound). In various embodiments, speaker 116 may be capable of producing an emitted acoustic signal anywhere in the range between 20 Hz and 50 kHz. Other acoustic ranges are possible and anticipated. In some embodiments, a speaker 116 may only be functional over a portion of this acoustic range such as between 20 Hz and 25 kHz, between 19 kHz and 50 kHz, etc. In some embodiments, speaker 116 may be capable of emitting acoustic signals at higher frequencies above the range of human hearing, such as between 20 kHz and 100 kHz, though the speaker 116 may not be functional over this entire range. Speaker 116 may be, without limitation: a moving coil speaker, a piezoelectric speaker, or any other suitable type of speaker. In some embodiments, more than one speaker 116 may be included in electronic device 100A, and the speakers may have the same or different acoustic ranges.

A microphone 117 (including microphones 117-1 and 117-2) may be any type of microphone which receives an acoustic signal (i.e., a sound) and converts it to a corresponding electrical audio signal. A microphone 117 may comprise, without limitation, a piezoelectric microphone, a micro-electrical mechanical system (MEMS) microphone; an electrostatic microphone, or any other suitable type of microphone. A microphone 117 (e.g., 117-1, 117-2) operates to receive acoustic signals that are emitted by speaker 116, and is thus operable at least in the range of the acoustic signals emitted by speaker 116 for acoustically inferring ambient temperature. In some embodiments, two, three, four, or more microphones 117 may be included in an electronic device 100A.

Figure 1B:
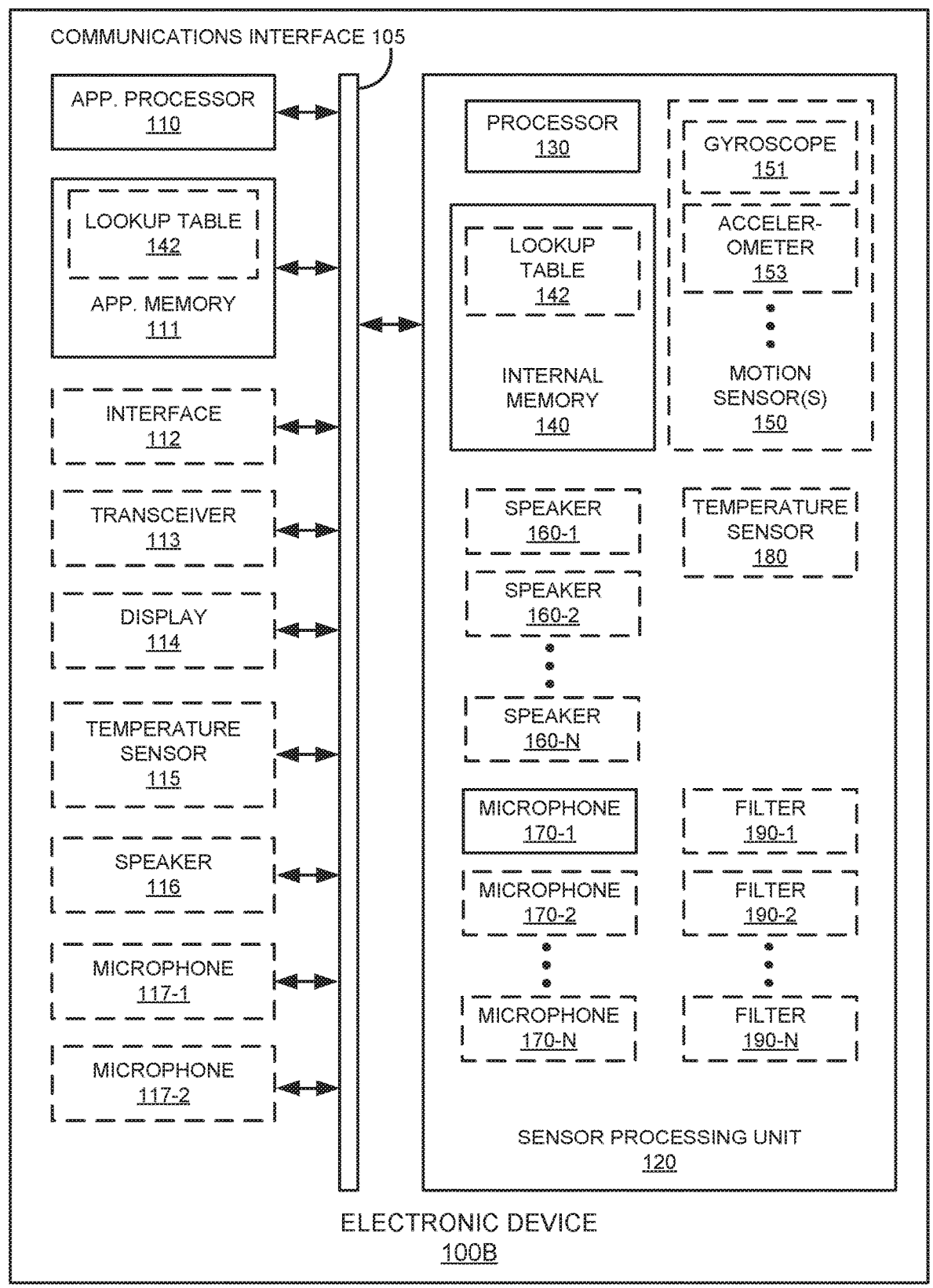
FIG. 1B shows a block diagram of an example electronic device comprising a sensor processing unit (SPU) unit, in accordance with various aspects of the present disclosure.

FIG. 1B shows a block diagram of an example electronic device 100B comprising a sensor processing unit (SPU) 120, in accordance with various aspects of the present disclosure. The host portion (communications interface 105 and the components to the left of communications interface 105) of electronic device 100B is the same as electronic device 100A, except that speaker 116 and microphones 117-1 and 117-2 are shown in broken line to indicate that in some embodiments one or more may not be included in electronic device 100B. Like electronic device 100A, in some embodiments, electronic device 100B may be a "mobile electronic device." Herein, electronic devices 100A and 100B are referred to generically and interchangeably as "electronic device 100." As illustrated in FIG. 1B, application processor 110 may be coupled to SPU 120 through communications interface 105.

In this illustrated embodiment of FIG. 1B, SPU 120 comprises: a sensor processor 130; internal memory 140; one or more speakers 160 (e.g., at least one of speakers 160-1, 160-2 . . . 160-N); and two or more microphones 170 (e.g., at least two of microphones 170-1, 170-2 . . . 170-N). With respect to SPU 120, components showed in broken line (i.e., dashed boxes) may not be included in some embodiments. Accordingly, in some embodiments, electronic device 100A may additionally include one or some combination of: motion sensors 150 (e.g., gyroscope 151, accelerometer 153, and/or other motion sensors such as a magnetometer); temperature sensor 180, and filter(s) 190 (e.g., one or more of filters 190-1, 190-2 . . . 190-N). In various embodiments, SPU 120 or a portion thereof, such as sensor processor 130, is communicatively coupled with application processor 110, application memory 111, and other components of electronic device 100B through communications interface 105 or other well-known means. SPU 120 may also comprise a communications interface (not shown) similar to communications interface 105 and used for communications among one or more components within SPU 120.

Processor 130 can be one or more microprocessors, CPUs, DSPs, general purpose microprocessors, ASICs, ASIPs, FPGAs or other processors that run software programs, which may be stored in memory such as internal memory 140 (or elsewhere), associated with the functions of sensor processing unit (SPU) 120. In some embodiments, sensor processor 130 operates to control the emission and timing of acoustic signals from one or more of speakers 116 and 160 and the timing of receipt of acoustic signals by one or more of microphones 117 and 170. Sensor processor 130 also operates to control and configure motion sensor(s) 150, temperature sensor 180, and filters 190 when included. For example, sensor processor 130 may set the output data rate and full-scale data rate for gyroscope 151 and, or accelerometer 153. Similarly, sensor processor 130 may set the band pass frequencies for filters 190. In some embodiments, sensor processor 130 operates to perform calculations which correlate time delays and/or phase-shifts between receipt of acoustic signals at various microphone pairs (e.g., 170-1 and 170-2; 117-1 and 117-2; 117-1 and 170-2, etc.) with ambient temperature values. In some embodiments, one or more of the functions described as being performed by sensor processor 130 may be shared with or performed in whole or in part by another processor of an electronic device 100, such as application processor 110.

As will be appreciated, the application (or host) processor 110 and/or sensor processor 130 may be one or more microprocessors, central processing units (CPUs), microcontrollers or other processors which run software programs for electronic device 100 and/or for other applications related to the functionality of electronic device 100. For example, different software application programs such as menu navigation software, games, camera function control, navigation software, and phone or a wide variety of other software and functional interfaces can be provided. In some embodiments, multiple different applications can be provided on a single electronic device 100, and in some of those embodiments, multiple applications can run simultaneously on electronic device 100. Multiple layers of software can, for example, be provided on a computer readable medium such as electronic memory or other storage medium such as hard disk, optical disk, flash drive, etc., for use with application processor 110 and sensor processor 130. For example, an operating system layer can be provided for electronic device 100 to control and manage system resources in real time, enable functions of application software and other layers, and interface application programs with other software and functions of electronic device 100. In various example embodiments, one or more motion algorithm layers may provide one or more of: temperature sensing algorithms which utilize emitted and received acoustic signals for inferring ambient atmospheric temperature; motion algorithms for lower-level processing of raw sensor data provided from internal or external sensors; and the like. Further, a sensor device driver layer may provide a software interface to the hardware sensors of electronic device 100. Some or all of these layers can be provided in the application memory 111 for access by the application processor 110, in internal memory 140 for access by the sensor processor 130, or in any other suitable architecture (e.g., including distributed architectures).

Internal memory 140 can be any suitable type of memory, including but not limited to electronic memory (e.g., read only memory (ROM), random access memory (RAM), or other electronic memory). Internal memory 140 may store algorithms, routines, or other instructions for instructing sensor processor 130 on the processing of data output by one or more of the motion sensors 150. In some embodiments, internal memory 140 may store a lookup table 142 that includes stored data that correlates time delays, phase-shifts, or other measurements between receipt of acoustic signals at various microphone pairs (e.g., pair 170-1 and 170-2, pair 117-1 and 117-2; pair 170-1 and 117-1, etc.) with ambient temperature values which cause the particular time delays.

Motion sensors 150, when included, may be implemented as MEMS-based motion sensors, including inertial sensors such as a gyroscope or accelerometer, or an electromagnetic sensor such as a Hall effect or Lorentz field magnetometer. In some embodiments, at least a portion of the internal sensors 150 may also, for example, be based on sensor technology other than MEMS technology (e.g., CMOS technology, etc.). As desired, one or more of the motion sensors 150 may be configured to provide raw data output measured along three orthogonal axes or any equivalent structure. Motion sensor(s) 150 are communicatively coupled with sensor processor 130 by a communications interface, bus, or other well-known communication means. When a mobile version of electronic device 100B includes one or more motion sensors 150 and is carried and/or worn on the person of the user, the motion and/or orientation in space of the electronic device are sensed by the motion sensor(s) 150 when the electronic device is moved in space by the user or the movements of the user.

As discussed herein, various aspects of this disclosure may, for example, comprise processing various sensor signals indicative of device motion and/or orientation. These signals are generally referred to as "motion data" herein. Non-limiting examples of such motion data are signals that indicate accelerometer, gyroscope, and/or magnetometer data in a coordinate system. The motion data may refer to the processed or non-processed data from the motion sensor(s). In an example implementation, data from an accelerometer, gyroscope, and/or magnetometer may be combined in a so-called data fusion process, performed, for example, by sensor processor 130, in order to output motion data in the form of a vector indicative of device orientation and/or indicative of a direction of device motion. Such a vector may, for example, initially be expressed in a body (or device) coordinate system. Such a vector may be processed by a transformation function that transforms the orientation vector to a world coordinate system. The motion and/or orientation data may be represented in any suitable reference frame, and may be represented in any suitable form, such as for example, but not limited to, quaternions, orientation matrices, or Euler angles.

A speaker 160 (e.g., one or more of speakers 160-1, 160-2 . . . 160-N), when included, may be any type of speaker which converts an electrical audio signal into a corresponding emitted acoustic signal (i.e., a sound). In various embodiments, a speaker 160 may be capable of producing an emitted acoustic signal anywhere in the range between 20 Hz and 50 kHz. Other acoustic ranges are possible and anticipated. In some embodiments, a speaker 160 may only be functional over a portion of this acoustic range such as between 20 Hz and 25 kHz, between 19 kHz and 50 kHz, etc. In some embodiments, a speaker 160 may be capable of emitting acoustic signals at higher frequencies above the range of human hearing, such as between 20 kHz and 100 kHz, though the speaker 160 may not be functional over this entire range. A speaker 160 may be, without limitation: a moving coil speaker, a piezoelectric speaker, or any other suitable type of speaker. In some embodiments, a speaker 160 may be based on MEMS technology. In some embodiments, more than one speaker 160 may be included, and the speakers may have the same or different acoustic ranges.

A microphone 170 (including one, two, or more of microphones 170-1, 170-2 . . . 170-N) may be any type of microphone which receives an acoustic signal (i.e., a sound) and converts it to a corresponding electrical audio signal. A microphone 170 may comprise, without limitation, a piezoelectric microphone, a micro-electrical mechanical system (MEMS) microphone; an electrostatic microphone, or any other suitable type of microphone. A microphone 170 (e.g., 117-1, 117-2 . . . 170-N) operates to receive acoustic signals that are emitted by any of speakers 116 and/or 160, and is thus operable at least in the range of the acoustic signals emitted by speaker 116/160 from which it is receiving acoustic signals for acoustically inferring ambient temperature.

Temperature sensor 180, when included, is a non-acoustic means of measuring ambient atmospheric temperature of the environment of temperature sensor 180. That is, temperature sensor 180 does not utilize sound in the determination of temperature. Temperature sensor 180, may comprise, without limitation: a solid state electrical temperature sensor, or an electromechanical temperature sensor. In some embodiments, acoustical inference of ambient atmospheric temperature is only performed when a reading from temperature sensor 180 is within a defined range. One example of such range is between −20 and 45 degrees Celsius. Other ranges are possible.

Filter(s) 190, when included, comprise one or more band-pass filters that are configured to pass a band of frequencies of interest. In the embodiments described herein, the band passed is typically centered upon the frequency of the acoustic signal that is emitted from a speaker for the purposes of inferring ambient atmospheric temperature. In some embodiments, a separate filter 190 exists for each microphone employed for inferring ambient atmospheric temperature. Filters are used in some embodiments, because a microphone 170 may pick up many other signals besides the desired one. An example of a bandpass filter includes, but is not limited to, a Butterworth second order filter, with a passband cutoffs of 10% lower and 10% higher than the frequency of the acoustic signal emitted by a speaker for purposes of inferring ambient atmospheric temperature. Other center frequencies and narrower or broader band pass ranges are possible.

The discussion of FIGS. 2 through 7 will provide further example details of at least the operation of the electronic device 100 and/or SPU 120 with respect to using emitted and received acoustic signals to infer ambient atmospheric temperature. It should be understood that any or all of the functional modules discussed herein may be implemented in a pure hardware implementation and/or by one or more processors operating in accordance with software instructions. It should also be understood that any or all software instructions may be stored in a non-transitory computer-readable storage medium.

Example of Acoustically Inferring Ambient Atmospheric Temperature

Figure 2:
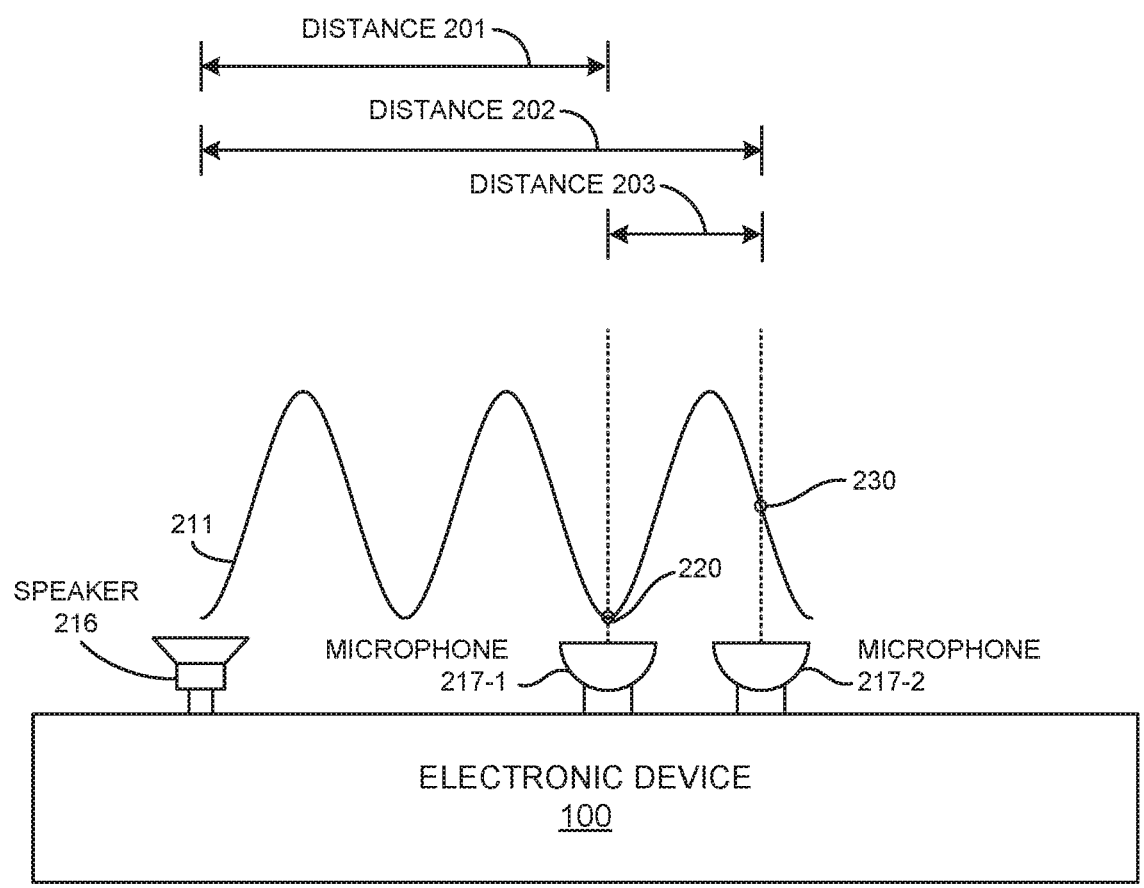
FIG. 2 illustrates an example electronic device which includes at least one speaker and at least two microphones, in accordance with various aspects of the present disclosure.

FIG. 2 illustrates an example electronic device 100 which includes at least one speaker 216 and at least two microphones 217-1 and 217-2, in accordance with various aspects of the present disclosure. The distances, phase-shift, time delay, and/or frequencies illustrated in FIG. 2 are notional and not intended to be to scale for any of the described embodiments.

It should be appreciated that, in various embodiments, speaker 216 can be any speaker selected from speakers 116, 160-1, 160-2 . . . 160-N illustrated in FIGS. 1A and 1B, and microphones 217-1 and 217-2 can be any pair of microphones selected from microphones 117-1, 117-2, 170-1, 170-2 . . . 170-N illustrated in FIGS. 1A and 1B. For example, in one embodiment, speaker 160 is utilized as speaker 216 and microphones 170-1 and 170-2 are utilized as microphones 217-1 and 217-2 respectively. In another embodiment, speaker 116 is utilized as speaker 216 and microphones 117-1 and 117-2 are utilized as microphones 217-1 and 217-2 respectively. In another embodiment, speaker 116 is utilized as speaker 216 and microphones 170-1 and 170-2 are utilized as microphones 217-1 and 217-2 respectively. In another embodiment, speaker 160 is utilized as speaker 216 and microphones 170-1 and 170-2 are utilized as microphones 217-1 and 217-2 respectively. The only restrictions are that: 1) the spatial relationship between the utilized combination of speakers and microphones must be something that is predetermined and stored in a memory (e.g., application memory 111 and/or internal memory 140) of the electronic device; and 2) the combination must be able to transmit an acoustic signal and receive the acoustic signal (i.e., they must all operate in the frequency range of the signal that is transmitted). Although FIG. 2 shows speaker 216 and microphone 217-1 and 217-2 on the same side of electronic device 100, one or more of speaker 216 and microphones 217 may also be on other sides or faces of the electronic device 100.

As depicted in FIG. 2, there is a first distance between speaker 216 and microphone 217-1 and a greater second distance 202 between speaker 216 and microphone 217-2. The difference between the first and second distances is a known third distance 203. This third distance is either stored in memory (e.g., application memory 111 and/or internal memory 140) or utilized in calculations that generate data stored in a lookup table 142 disposed in memory (e.g., in application memory 111 and/or internal memory 140). In some embodiments, this known third distance is as low as 0.1 centimeters and as great as 25 centimeters, or somewhere in the range between. In other embodiments, the range may be smaller, such as at or between 0.1 centimeters and 5 centimeters. In other embodiments third distance 203, may be larger, such as up to 50 centimeters, when the size of electronic device 100 is large enough to support such a separation. Although depicted as being in a linear relationship, speaker 216, microphone 217-1, and microphone 217-2 may be an any relationship and in different planes, so long as distance 202 is greater than distance 201 and the differential between the distances (distance 203) is known.

Acoustic signal 211 is emitted from speaker 216. Measurement 220 represents a measurement of acoustic signal 211 at microphone 217-1, and measurement 230 represents a measurement of acoustic signal 211 at microphone 217-2. Because of the difference in distance 203, acoustic signal 211 reaches microphone 217-1 and microphone 217-2 at a different phase. Thus, there is a phase difference between measurement 220 and measurement 230. Because the speed of sound depends on the temperature of the air through which acoustic signal 211 travels, the wavelength of acoustic signal 211 depends on the temperature. Therefore, the phase difference depends on the temperature, since distance 203 is constant.

For purposes of example, and not of limitation, in one embodiment signal 211 is a sine wave at a frequency of 20 kHz, and distance 203 is 1 centimeter. Results for this example are discussed and depicted in graphs shown in FIGS. 3, 4, 5, and 6.

A simplified equation for the speed of sound as a function of temperature is shown in Equation 1:

$$v = 331.4 + 0.6*T \qquad \text{Equation 1}$$

where v is the speed of sound in meters per second and T is Temperature in Celsius. With two or more microphones (e.g., microphones 217-1 and 217-2), the sound wave (e.g., acoustic signal 211) will propagate to the different microphones at different times if they are different distances from the loud speaker (e.g., speaker 216). In short, the sound wave gets to the closer microphone (e.g., microphone 217-1) first. Thus, there is a time shift on the signal from each microphone (217-1, 217-2) with respect to each other, and the time shift for a constant frequency is equivalent to a phase shift.

To compute the phase, processor 110 or sensor processor 130 can perform a Fast Fourier Transform (FFT) on the data of each microphone (e.g., 217-1 and 217-2) and find the phase of the peak. To lessen the computation complexity and processing time, as the calculations are only concerned with phase at one frequency, processor 110 or sensor processor 130 can take the Discrete Fourier Transform (DFT) at one point a shown in Equation 2:

$$F = \sum_{n=0}^{N-1} x_n \cdot \left( \cos\left( \frac{-2\pi \cdot N \cdot f \cdot n}{R} \right) + i \cdot \sin\left( \frac{-2\pi \cdot N \cdot f \cdot n}{R} \right) \right) \qquad \text{Equation 2}$$

Where, N is the number of points of the signal $x_n$, f is the frequency of the transmitted signal, and R is the sample rate of the signal. Equation 2 is often written in literature with k being in place of $$\frac{N \cdot f}{R}.$$

The substitution was done in Equation 2, in order to find the one point of the DFT at the frequency of interest.

It should be appreciated that "F" from Equation 2 is a complex number. The angle it represents is the arc tangent of imaginary component and real component of F as shown below in Equation 3.

$$\theta = a\tan 2(\text{imag}(F), \text{real}(F)) \qquad \text{Equation 3}$$

Figure 3:
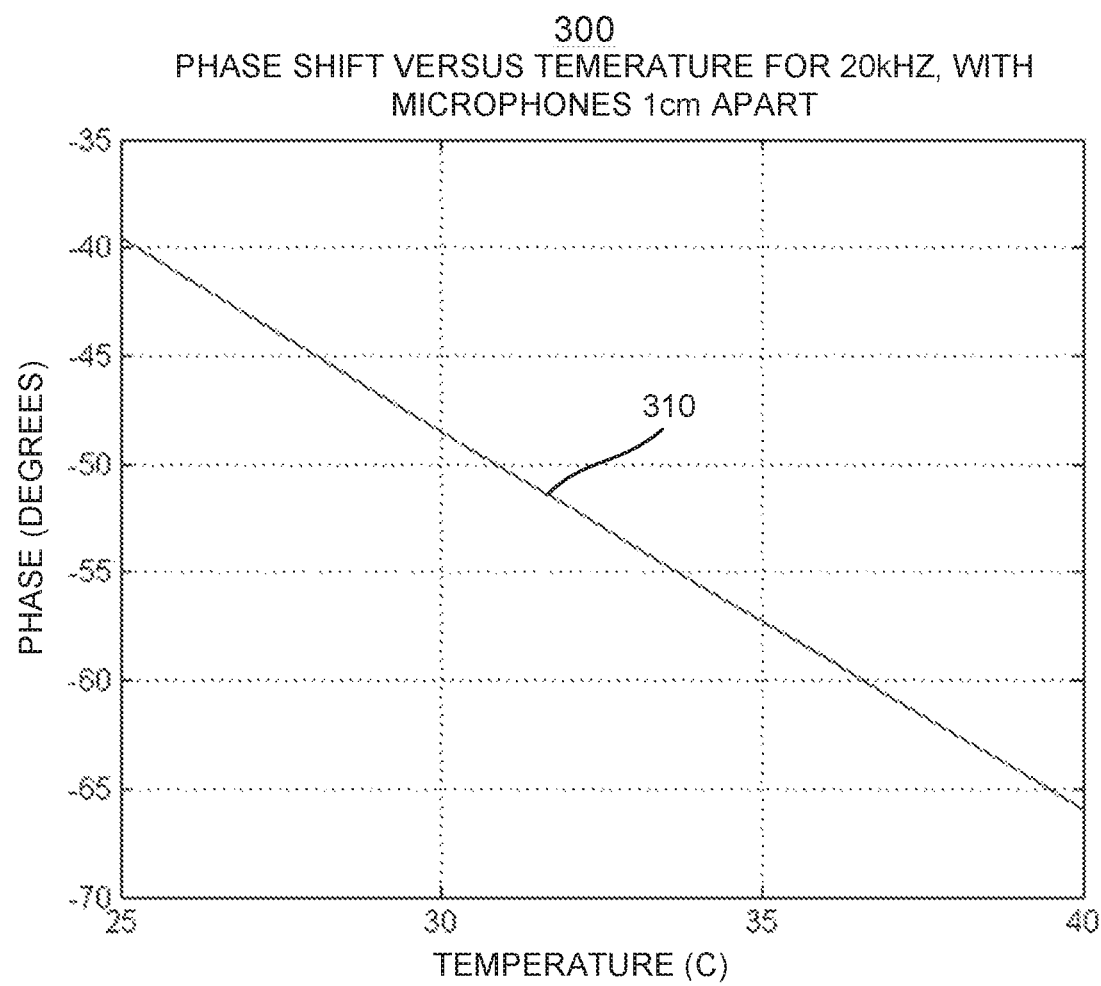
FIG. 3 illustrates an example graph of phase shift versus temperature for a 20 kHz acoustic signal measured by a pair of microphones disposed different distances from an emission source of the acoustic signal, according to various embodiments.

FIG. 3 illustrates an example graph 300 of phase shift versus temperature for a 20 kHz acoustic signal measured by a pair of microphones disposed different distances from an emission source of the acoustic signal, according to various embodiments. In the illustrated embodiment, the difference between the different distances is 1 centimeter, meaning that one of the two microphones (e.g., 217-2) is one centimeter further from speaker 216 than the other of the two microphones (e.g., microphone 217-1). The graphed data 310 illustrates phase shift in degrees on the y-axis versus temperature in Celsius on the x-axis. The calculations used to produce graphed data 310 can be computed on the fly by processor 110 and/or sensor processor 130 and/or computed in advance with correlated results stored, such as in lookup table 142, in application memory 111 and/or internal memory 140.

The complex signal resulting from Equation 2 on the first microphone signal may be represented by "a+b*i" and the complex signal resulting from Equation 2 on the second microphone signal may be represented by "c+d*i." Then, to avoid computing an arc tangent, the tangent of the phase difference can be computed and this tangent then used to identity for the difference of two angles, which simplifies into Equation 4, $$\Delta = \frac{a \cdot d - b \cdot c}{a \cdot c + b \cdot d} \qquad \text{Equation 4}$$

where $\Delta$ is the tangent of the phase difference. Using the same assumptions in FIG. 1, the arc tangent of the phase difference versus temperature in can be plotted as illustrated in FIG. 4.

Figure 4:
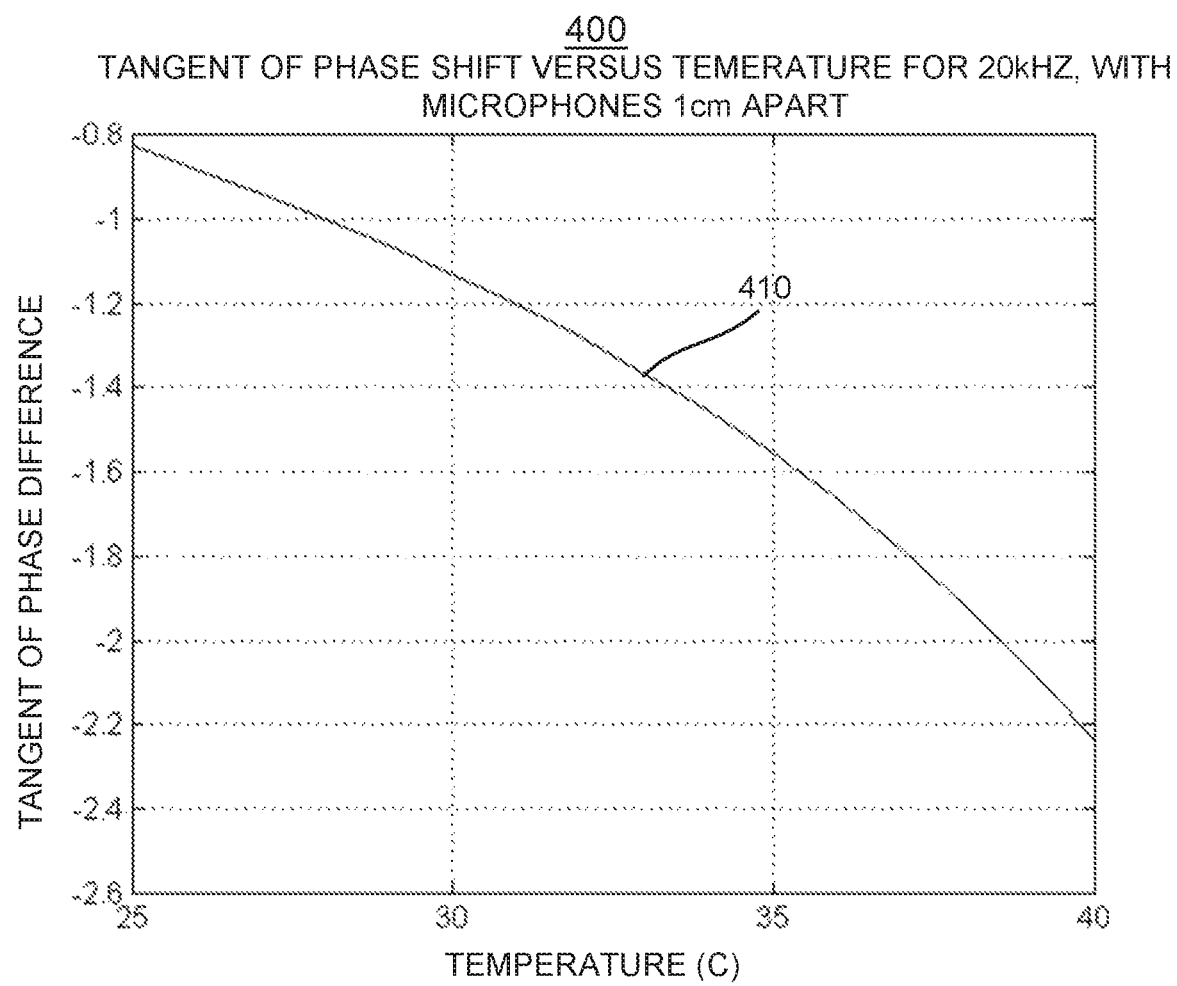
FIG. 4 illustrates an example graph of the arc tangent of phase difference versus temperature for a 20 kHz acoustic signal measured by a pair of microphones disposed different distances from an emission source of the acoustic signal, according to various embodiments.

FIG. 4 illustrates an example graph 400 of the arc tangent of phase difference versus temperature for a 20 kHz acoustic signal measured by a pair of microphones disposed different distances from an emission source of the acoustic signal, according to various embodiments. In the illustrated embodiment, the difference between the different distances is 1 centimeter, meaning that one of the two microphones (e.g., 217-2) is one centimeter further from speaker 216 than the other of the two microphones (e.g., microphone 217-1). Graphed data 410 illustrates the tangent of phase difference on the y-axis versus temperature in Celsius on the x-axis. The calculations used to produce graphed data 410 can be computed on the fly by processor 110 and/or sensor processor 130 and/or computed in advance with correlated results stored, such as in lookup table 142, in application memory 111 and/or internal memory 140.

The cosines and sines of Equation 1 can be simplified into a table lookup or calculated by a recursive manner, as is commonly known. After computing the phase difference, the temperature can be inferred using the expected shape graphed (e.g., graphed data 310, 410) and shown in FIG. 3 and/or FIG. 4, or via the same data correlated and stored in a lookup table 142.

The graphed data (e.g., graphed data 310, 410) used to estimate/infer temperature can also be adjusted based upon humidity if humidity is measured or otherwise known. Humidity has a small effect on the speed of sound and hence on the phase difference shown in the plots of FIGS. 3 and 4. Pressure and wind speed also have an effect and the curve could be adjusted based upon those parameters. Humidity and pressure can be measured or else estimated using internet data based on known location. Pressure can also be estimated based upon both internet data and measured altitude.

It should be appreciated that the plots illustrated by graphed data 310 and 410 assume the microphones (217-1 and 217-2) are sampled at the same time. If they are not sampled at the same time, then that would shift the curve from theoretical, but the principles described above still apply after factoring in the difference in measurement times. Alternatively, to correct for any difference in sampling time, the principles can be applied on two, or more, different known frequencies. Assuming that the difference in sampling time is constant for the different frequencies, and using the relation between frequency and phase, the unknown sampling time can be determined, using e.g., regression methods.

It should also be appreciated that the methods for inferring ambient atmospheric temperature described and illustrated in FIGS. 3 and 4 operate independently of the gain on microphones 217-1 and 217-2.

Although only two microphones were illustrated in the examples of FIGS. 2-4, more can be utilized. For example, given 3 microphones A, B, and C each a different distance from the loud speaker which emits an acoustic signal, the phase differences between A and B, B and C, and A and C can be computed. The three results can then be combined via any of various methods. One such combination method is averaging the three answers. Another combination method is weighting by the three answers by a function of the difference in distance between the microphone and loudspeaker.

Figure 5:
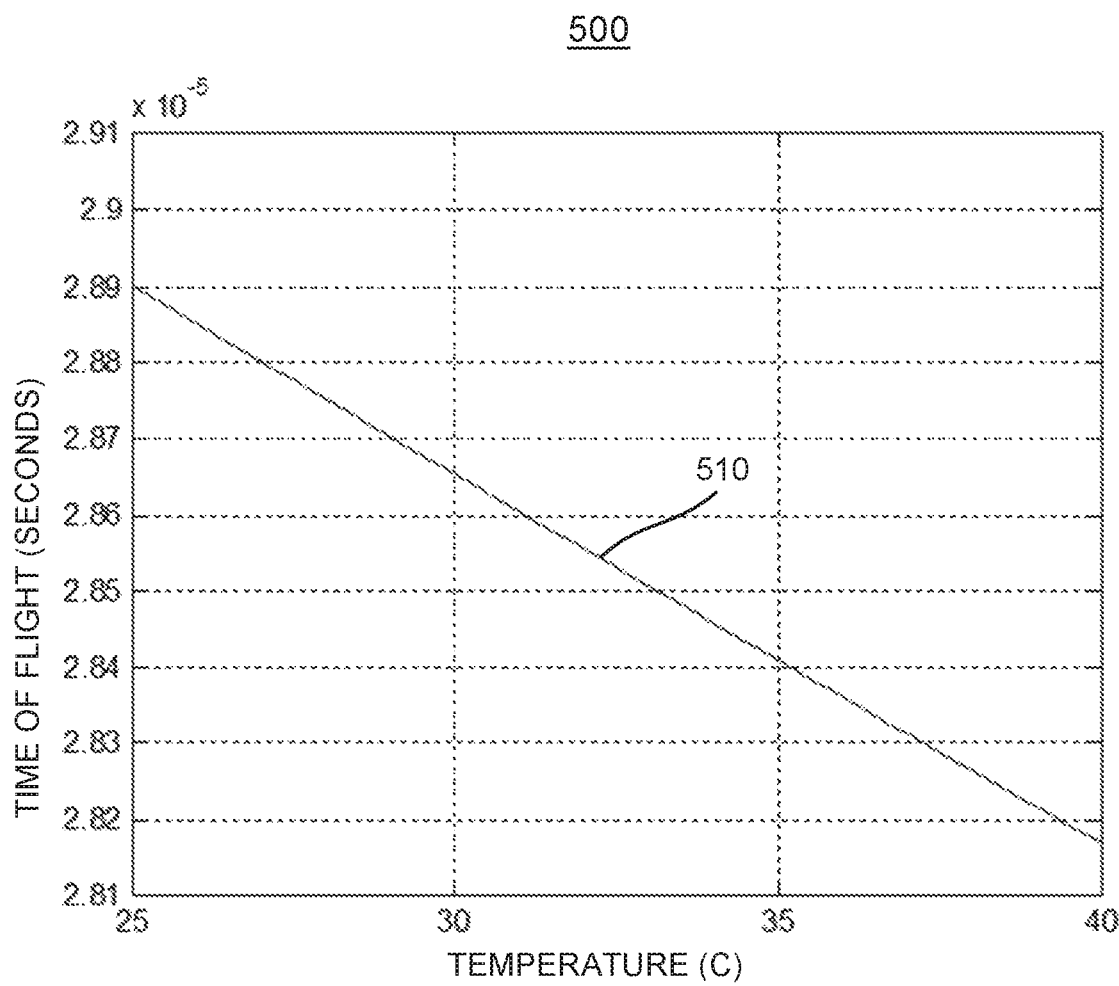
FIG. 5 illustrates an example graph of time-of-flight difference versus temperature for a 20 kHz acoustic signal measured by a pair of microphones disposed different distances from an emission source of the acoustic signal, according to various embodiments.

FIG. 5 illustrates an example graph 500 of time-of-flight difference versus temperature for a 20 kHz acoustic signal measured by a pair of microphones disposed different distances from an emission source of the acoustic signal, according to various embodiments. In the illustrated embodiment, the difference between the different distances is 1 centimeter, meaning that one of the two microphones (e.g., 217-2) is one centimeter further from speaker 216 than the other of the two microphones (e.g., microphone 217-1). The graphed data 510 illustrates time difference on the y-axis versus temperature in Celsius on the x-axis. The calculations used to produce graphed data 510 can be computed on the fly by processor 110 and/or sensor processor 130 and/or computed in advance with correlated results stored, such as in lookup table 142, in application memory 111 and/or internal memory 140.

Ad depicted in FIG. 5, phase difference between two signals can also be characterized as a time difference between the two signals. The phase difference results from a difference in the time-of-flight between a speaker and a microphone and between the same speaker and a different microphone. By looking at the time-of-flight difference, the system does not have to have strict timing between the speaker and the microphones. The time-of-flight difference is the distance difference divided by the velocity (see Equation 5). An example would be for a sound velocity of 346.4 m/s and a microphone difference (e.g., distance 203) of 1 cm, would be a time-of-flight difference of 28.868 us. The 346.4 m/s for sound velocity comes from Equation 1 for 25° C. for temperature. The time-of-flight scales linearly with the distance difference, so there is a 28.868 μs time-of-flight difference per centimeter of microphone distance difference (e.g., distance 203) of microphone to speaker.

$$\text{time} = \frac{\text{distance}}{\text{velocity}} \qquad \text{Equation 5}$$

While the time difference is small over only 1 cm it is noticeable as a phase shift, also note that the time difference will increase if it is measured over larger distance (e.g., if distance 203 is larger than 1 cm). The expected phase shift would be the time-of-flight difference times the frequency times 360 degrees for units in degrees or a for units in radians. The result of converting the time-of-flight shown in FIG. 5 to phase shift is shown in FIG. 6.

Figure 6:
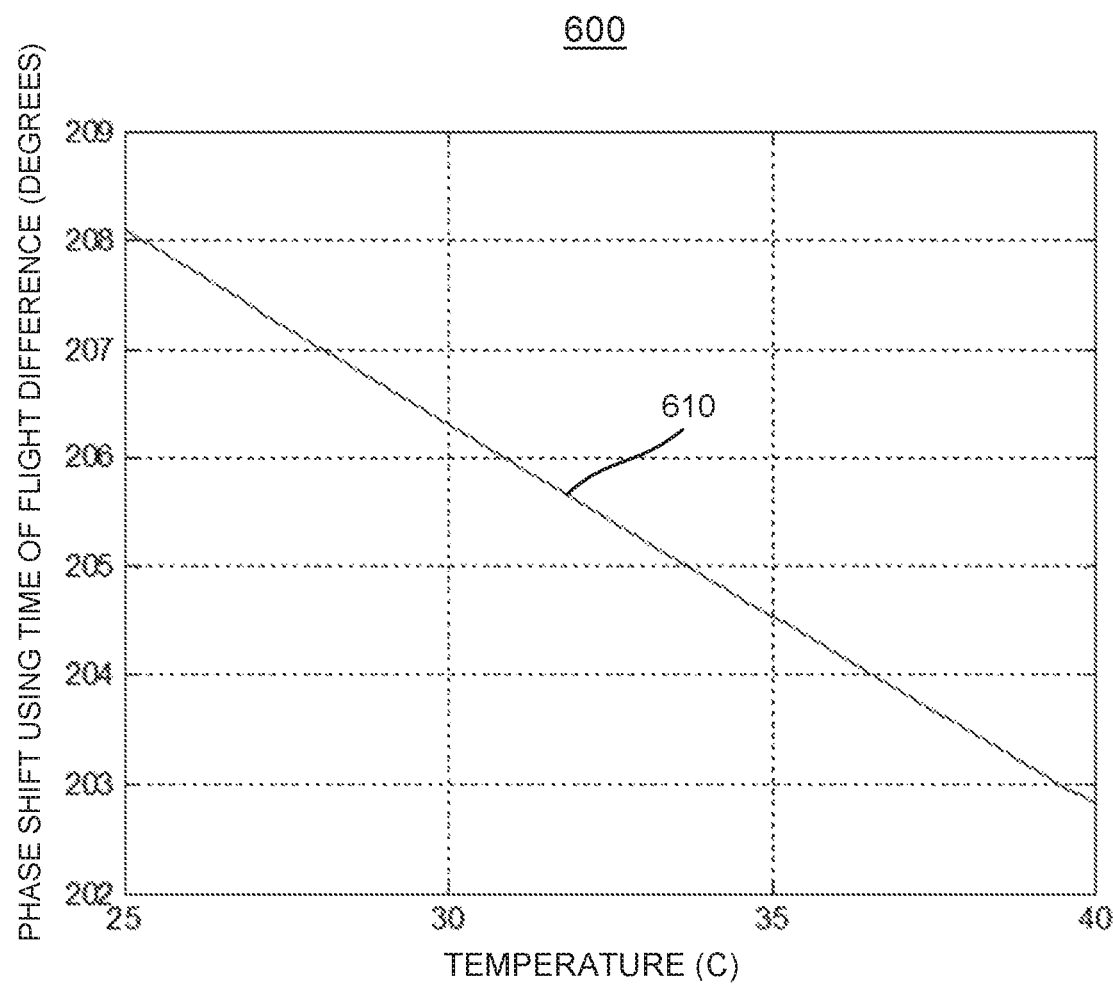
FIG. 6 illustrates an example graph of phase shift converted from time-of-flight difference versus temperature for a 20 kHz acoustic signal measured by a pair of microphones disposed different distances from an emission source of the acoustic signal, according to various embodiments.

FIG. 6 illustrates an example graph 600 of phase shift converted from time-of-flight difference versus temperature for a 20 kHz acoustic signal measured by a pair of microphones disposed different distances from an emission source of the acoustic signal, according to various embodiments. In the illustrated embodiment, the difference between the different distances is 1 centimeter, meaning that one of the two microphones (e.g., 217-2) is one centimeter further from speaker 216 than the other of the two microphones (e.g., microphone 217-1). The graphed data 610 illustrates the phase shift in degrees (calculated from time-of-flight) on the y-axis versus temperature in Celsius on the x-axis. The calculations used to produce graphed data 610 can be computed on the fly by processor 110 and/or sensor processor 130 and/or computed in advance with correlated results stored, such as in lookup table 142, in application memory 111 and/or internal memory 140.

As with FIGS. 3 and 4, the graphs illustrated in FIGS. 5 and 6 assume that microphones 217-1 and 217-2 capture their acoustic signal samples simultaneously. If this is not the case, then adjustments for the time difference between the capture of the two samples can be made. For example, the difference in the sampling times can be included in the time of flight difference as shown above in FIG. 5. The difference in the sampling times can also be adjusted in the phase calculation as shown above for converting the data of FIG. 5 to the data graphed in FIG. 6. For example, the phase would shift by 360 degrees times frequency times the sample time difference. In some embodiments, multiple different frequencies can be used, as discussed is relation to FIGS. 3 and 4, to cancel out an unknown difference in sampling time.

Wrapping and Multipath

To get around phase wrapping, a lower frequency (e.g., for acoustic signal 211) can be used and/or multiple frequencies (instead of a single frequency acoustic signal 211) can be used. Multiple frequencies can be used either separated in time or at the same time. The acoustic signal can also be encoded with another signal to help with wrapping and/or multipath. One method of coding is to change the sign of the amplitude which is equivalent to a 180 degree phase shift. For example, a coding sequence such as Gold Code can be placed upon the acoustic signal (e.g., signal 211) which is used as a carrier frequency. Another type of coding that can be used, is to zero out the amplitude for predetermined periods of time. Using coding helps solve multipath, because the signal being matched against can be lined up and the shortest distance to a match can be chosen as the difference. Conversely, without coding, it is much more difficult to match up the beginning of a sine wave acoustic signal by itself when noise is also embedded on top of the acoustic signal.

Motion and Other Sensors

Because the time-of-flight and phase difference measurements discussed above are measurements of velocity, it may also be important, in some instances to know the velocity (if any) of electronic device 100. This can be important because motion of an electronic device 100 may create an artifact, which may be negligible or may be important depending on the velocity and how accurate the inferred temperature is required to be. By knowing motion of an electronic device 100 tightly timed with the acoustically based inference of ambient atmospheric temperature, compensation can take place and/or inference of temperature can be suspended if the motion is too great. The motion may be determined using motion sensors, such as an accelerometer, or gyroscope, of the electronic device. The speed of motion may be determined from either one or both types of motion sensors, and the derived speed may then be used, for example in Equation 1, to correct for the speed of the device in the inference of temperature. Alternatively, if the motion is below a preset threshold, the motion sensor may send a sync signal or set a flag to indicate that the temperature may be inferred without being disturbed by the speed of the device. Inertial and motion sensors may also be used to determine the orientation of the device, and if the device is in an orientation that does not enable temperature determination, e.g., with speaker and or mics of table surface, the process is not performed. If different speakers and microphones are available, for example on different faces of the device, the orientation information may be used to select to most appropriate speaker and microphones combination. For example, if there are more than three microphones two microphones can be selected based on their orientation (e.g., select two that are on a side of the electronic device that is not facing downward, as facing downward may be an indication of the device laying on a table and thus impeding reception of any microphones that face the table). In the same fashion, a speaker may be chosen from a plurality of speakers based on being on the same side of the electronic device as one or more of the chosen microphones and/or based on not being muffled by facing down onto a surface such as a table. Similarly, if based on activity recognition or position calculations using the motion sensors and/or other sensors, it is determined that the location of the device does not allow the determination of the temperature, for example, if the determination indicates the device is in the user's pocket, the process is not performed.

If the device is equipped with an internal temperature sensor, the data from this temperature sensor may also be used. For example, if the temperature sensor indicates that the device is very hot, e.g., a smartphone was left in the sun, this would indicate that the temperature that could be inferred by the phase shift calculations would probably not be representative of the temperature of the atmosphere. Alternatively, the temperature inferred through the phase shift may be used to determine the effect of the internal temperature of the device on the temperature at the surface of the device. Under stable conditions, the internal temperature sensor may also be used to calibrate the temperature inferred using the phase shift, and the correct for unknown factors, such as e.g., unknown sampling times or unknown sampling delays or processing delays as discussed above. In some instances, such as when the electronic device 100 is left in hot conditions such as inside of an automobile on a hot sunny day or overnight on a cold evening, the electronic device may heat up or cool down and cause the internal temperature sensors to provide readings that are different from an ambient temperature that an electronic device is located within (e.g., if the electronic device is carried into a temperature controlled building). For example, the device may remain hot or cold for a while even in the ambient temperature around the device changes. Inaccurate ambient temperature readings from the internal temperature sensors may continue until the internal components equalize in temperature to the ambient temperature. When such conditions are noted, such as when the internal temperature sensor measures below or above a preset threshold, the electronic device 100 may utilize the acoustic sensors for measurements of ambient temperature when there is difference between the temperature measured by the internal temperature sensor and the acoustically inferred temperature.

The various embodiments above show that different sensors may be used to either test if conditions allow that the temperature is inferred using the acoustic methods described herein, or may be used to correct the inferred temperature. Furthermore, when a temperature sensor is present, the temperature reading from the temperature sensor and the inferred temperature may be combined, or one of the temperatures may be selected based on their comparison, and a condition test.

Architecture

In some embodiments, a portion of the computations for inferring temperature from acoustic signal measurements can be computed outside of sensor processor 130. For example, while sensor processor 130 operates microphones (inside of sensor processing unit 120, outside of sensor processing unit 120, or some combination of inside and outside), Equation 2 can be computed by processing system 120 or on a motion or audio DSP of sensor processing unit 120 or elsewhere in electronic device 100, while Equation 3 or Equation 4 used with FIG. 3 or FIG. 4 can be computed on the host processor 110 to get temperature. This keeps the DSP type math computations on the type of processor that is optimized for this type of computation and the division computations and table lookups on the host processor 110 which is better at these types of tasks.

Example Methods of Operation

Figure 7:
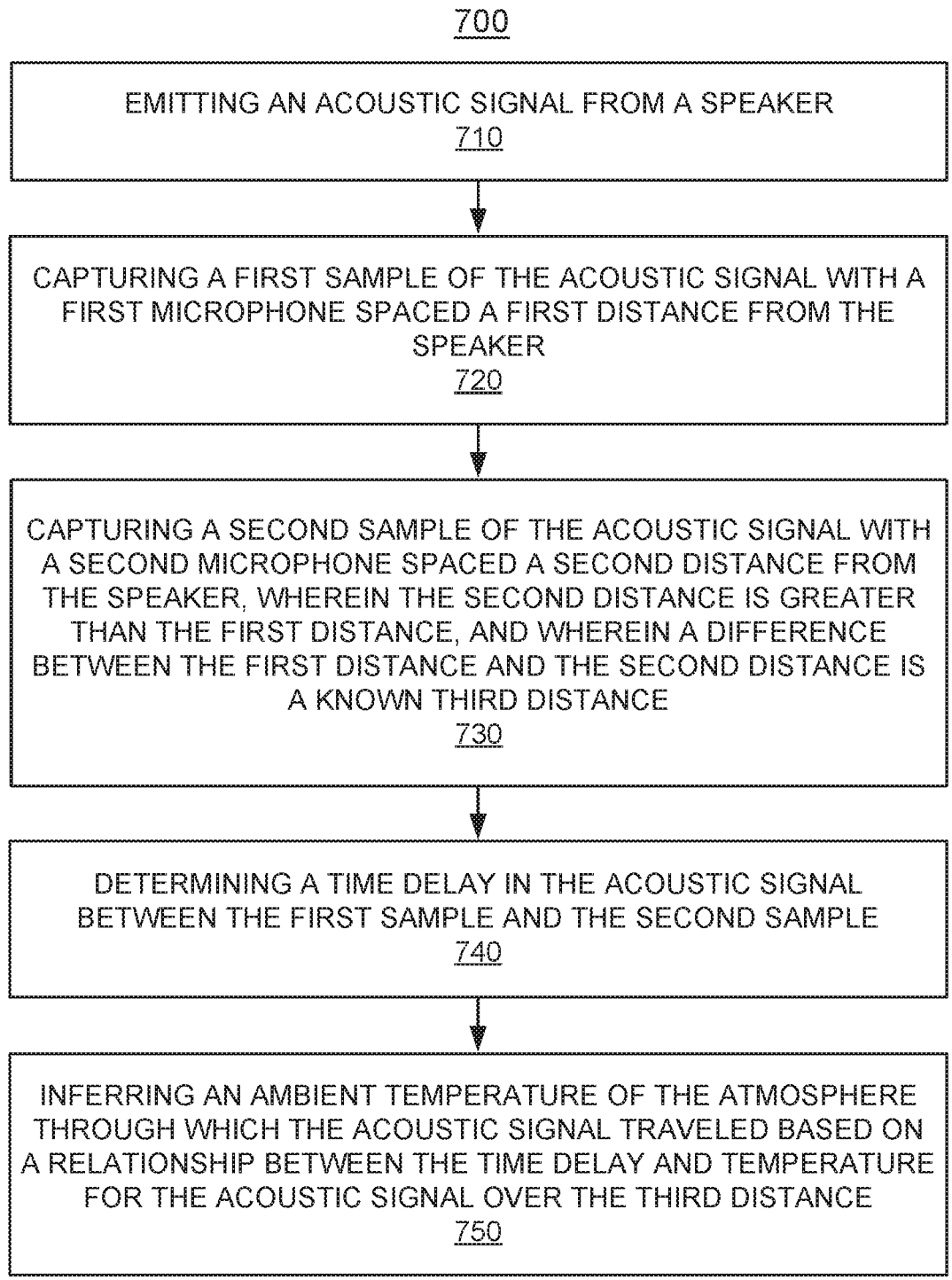
FIG. 7 illustrates a flow diagram of an example method of inferring ambient atmospheric temperature, in accordance with various aspects of the present disclosure.

FIG. 7 illustrates a flow diagram 700 of an example method of inferring ambient atmospheric temperature, in accordance with various aspects of the present disclosure. Procedures of this method will be described with reference to elements and/or components of one or more of FIGS. 1A-6. It is appreciated that in some embodiments, the procedures may be performed in a different order than described, that some of the described procedures may not be performed, and/or that one or more additional procedures to those described may be performed. Flow diagram 700 includes some procedures that, in various embodiments, are carried out by one or more processors (e.g., sensor processor 130, application processor 110, or the like) under the control of computer-readable and computer-executable instructions that are stored on non-transitory computer-readable storage media (e.g., application memory 111, internal memory 140, or the like). It is further appreciated that one or more procedures described in flow diagram 700 may be implemented in hardware, or a combination of hardware with firmware and/or software.

With reference to FIG. 7, at procedure 710 of flow diagram 700, in various embodiments, an acoustic signal is emitted from a speaker of an electronic device 100. In some embodiments, this comprises a processor 110 or sensor processor 130 directing and/or operating the speaker (e.g., speaker 216 of FIG. 2) to emit a signal (e.g., acoustic signal 211) of a certain frequency or plurality of frequencies. In some embodiments, the acoustic signal is emitted from the speaker in at predetermined periodic intervals, such as every minute, every 5 minutes, every 10 minutes, etc. In some embodiments, the acoustic signal is emitted from the speaker in response to a process or component of the electronic device requesting the ambient atmospheric temperature. In some embodiments, the acoustic signal is emitted from the speaker in response to a to a user of the electronic requesting the ambient atmospheric temperature, such as via interaction with an interface (e.g., interface 112) of the electronic device 100. In some embodiments, a human audible signal (e.g., a signal at 3 kHz, 7 kHz, or some other human audible frequency or combination of frequencies that includes at least one human audible frequency) may be emitted from the speaker or from another speaker contemporaneously with or slightly before or after (e.g., 0.5 seconds before or after) the acoustic signal in order to provide user feedback in response to the request. This may be accomplished by emitting a tone, beep, or some other human audible sound when the acoustic signal itself is not in the human audible range of human. In some embodiments, the human audible sound may be both the emitted acoustic signal and a feedback signal for a human user of an electronic device 100. In some embodiments, the acoustic signal may be combined with other audible sounds emitted by the device as directed by other applications. For example, an application may play a sound for e.g., a notification, and the acoustic signal may be combined with the notification sound, or the notification sound may serve as the acoustic signal (with or without adaptation).

The emitted acoustic signal may be a single frequency signal or a signal comprising a plurality of frequencies. The emitted acoustic signal may be of any frequency or frequencies within a range of frequencies, such as the range of 20 Hz to 21 kHz, the range of 19 kHz to 50 kHz; the range of 20 Hz to 50 kHz, or some other range. In some embodiments, the emitted acoustic signal is purposely either within, above, or below the human audible range. In some embodiments, the emitted acoustic signal may comprise a known pattern of frequencies. In some embodiments, the emitted frequency may comprise a pseudorandom noise code.

With continued reference to FIG. 7, at procedure 720 of flow diagram 700, in various embodiments, a first sample of the acoustic signal is captured with a first microphone spaced a first distance from the speaker. In some embodiments, this comprises processor 110 or sensor processor 130 directing and/or operating a first microphone (e.g., microphone 217-1) disposed as a part of an electronic device 100 to capture a sample of an acoustic signal that has been emitted from a speaker (e.g., speaker 216). With reference to FIG. 2, distance 201 is an example of the first distance. The sample may be of a predetermined duration, such a 10 µS, 1 mS, or some other length of time. In some embodiments, the sampling is further achieved by filtering raw sampled acoustic data sampled from the first microphone with a first filter (e.g., filter 190-1) that is configured to pass the acoustic signal. For example, the filter may comprise a band-pass filter configured to pass the frequency or frequencies of the acoustic signal. In an example where the acoustic signal is a 25 kHz signal, the band-pass filter may have a low frequency cutoff at 23.5 kHz and a high frequency cutoff of 26.6 kHz, with frequencies between the cutoffs being passed. Other upper and lower cutoffs are possible, as are other frequencies for the acoustic signal.

With continued reference to FIG. 7, at procedure 730 of flow diagram 700, in various embodiments, a second sample of the acoustic signal is captured with a second microphone spaced a second distance from the speaker. The second sample and first sample are captured simultaneously (with the same start time) in some embodiments. The second distance is greater than the first distance, and a difference between the first distance and the second distance is a known and predetermined third distance. In some embodiments, this comprises processor 110 or sensor processor 130 directing and/or operating a second microphone (e.g., microphone 217-2) disposed as part of an electronic device 100 to capture a sample of an acoustic signal that has been emitted from the speaker (e.g., speaker 216). With reference to FIG. 2, distance 202 is an example of the second distance, and distance 203 is an example of the third distance (the difference between the first and second distances). The sample may be of a predetermined duration, such a 10 µS, 1 mS, or some other length of time. In some embodiments, the sampling is further achieved by filtering raw second sample of acoustic data sampled from the second microphone with a filter. Where the first sample and second samples are captured simultaneously the filter comprises a second filter (e.g., filter 190-2) that is configured to pass the acoustic signal. For example, the second filter may comprise a band-pass filter configured to pass the frequency or frequencies of the acoustic signal. As in the above example, where the acoustic signal is a 25 kHz signal, this band-pass filter may have a low frequency cutoff at 23.5 kHz and a high frequency cutoff of 26.6 kHz, with frequencies between the cutoffs being passed. Where the first and second samples are not captured simultaneously or in a manner that overlaps in time of capture the first filter (e.g., filter 190-1) may be utilized to filter the raw sampled acoustic signals of both the first and second samples.

With continued reference to FIG. 7, at procedure 740 of flow diagram 700, in various embodiments, a time delay in the acoustic signal is determined between the first sample and the second sample. In some embodiments, this time delay comprises a time-of-flight delay that occurs over the span of the third distance (e.g., distance 203). Reference is made to the previous description of this determination of the time delay, with particular attention directed to the descriptions of Equations 1 and 5 and FIG. 5. In some embodiments, this time delay comprises a phase-shift that occurs over the span of the third distance (e.g., distance 203). Reference is made to the previous description of this determination of the phase-shift, with particular attention directed to the descriptions of Equations 1, 2, 3, and 4 and FIGS. 3, 4, and 6.

With continued reference to FIG. 7, at procedure 750 of flow diagram 700, in various embodiments, an ambient temperature of the atmosphere through which the acoustic signal traveled is inferred based on a relationship between the time delay and temperature for the acoustic signal over the third distance. As discussed herein, this inference can be calculated on-the-fly (e.g., in real time) by one or more of processor 110, sensor processor 130, and/or other processor(s) of electronic device 100. In other embodiments, some or all of these computations can be performed in advance for a plurality of time delays associated with the frequency or frequencies used in emitted acoustic signals (e.g., as acoustic signal 211) and the predetermined representations of the relationships between the time delays and inferred temperatures for specific third distances can be stored. For example, the time-of-flight delay results can be correlated with inferred temperatures (as depicted in FIG. 3) and then representations of these relationships can be stored in memory (e.g., application memory 111 and/or internal memory 140), such as in the form of lookup table 142. When lookup table 142 is utilized, a time-of-flight can be searched in the lookup table and its associated inferred temperature can be found and returned.

In some embodiments, inferring the ambient temperature of the atmosphere through which the acoustic signal has traveled may be further based on a humidity adjusted relationship between the time delay over the third distance and temperature for the acoustic signal over the third distance. For example, when a relative humidity is known either through measurement of by a sensor of electronic device 100 or via receipt from an outside source (e.g., via an Internet connected source) then the calculations described herein, can be adjusted for humidity. In other embodiments, entry criteria for a lookup table (e.g., lookup table 142) of predetermined relationships can further include the time-of-flight and the humidity and then return an associated inferred ambient atmospheric temperature for the time-of-flight and humidity that has been pre-calculated for a particular pair of speakers and a particular frequency of acoustic signal.

Some embodiments further comprise determining, from data provided by a sensor physically coupled with the speaker, a characteristic of the speaker. By "physically coupled" what is meant is being a component of the same SPU 120 as the speaker or being otherwise disposed as a component of an electronic device 100 (e.g., a mobile electronic device) of which the speaker is a component. Thus, the sensor is also coupled physically coupled with SPU 120 and electronic device 100. In response to the characteristic being within a predetermined envelope, the inferring of the ambient temperature of the atmosphere through which said acoustic signal traveled based on said relationship between said time delay and temperature for said acoustic signal over said third distance is accomplished. For example, the characteristic may be motion data provided by a motion sensor physically coupled with the speaker and the sensor processing unit. The motion data may describe an activity of the speaker such as, without limitation: swinging in an arc in the hand of a runner/walker, recording impacts of walking or running footsteps, identifying the orientation (face up/down) of a speaker, and/or identifying a velocity of travel of the speaker. For example, with reference to FIG. 1B, this can comprise motion sensor(s) 150 and speaker 160-1 being physically coupled together as portions of sensor processing unit 120. A motion sensor 150, such as gyroscope(s) 151 and/or accelerometer(s) 153 may provide data to sensor processor 130 which is utilized to calculate a velocity, orientation, activity etc. of sensor processing unit 120 and anything that is coupled thereto, such as speaker 160-1, speaker 116, and all of electronic device 100. In one embodiment, when the velocity is above a certain predetermined threshold, it may introduce artifacts into acoustic sampling and thus degrade the accuracy of temperature inference below an acceptable level for some applications. In some embodiments, responsive to the measured velocity being at or below a preset velocity threshold of a velocity envelope, the inference of the ambient temperature of the atmosphere through which the acoustic signal traveled is accomplished based on the relationship between the time delay and temperature for the acoustic signal over the third distance. When velocity is above the preset velocity threshold of a velocity envelope, this inference of ambient temperature is not accomplished. In some embodiments, motion by a motion sensor can indicate an orientation of a speaker, microphone, and/or electronic device in which the speaker and microphone. The orientation can be compared to an acceptable orientation envelope. Responsive to the speaker, microphone, and/or electronic device being an acceptable orientation (i.e., within the orientation envelope, such as by the speaker being oriented face up) the inference of the ambient temperature of the atmosphere through which the acoustic signal traveled is accomplished based on the relationship between the time delay and temperature for the acoustic signal over the third distance. When the orientation is outside of the orientation envelope (such as by indicating that a speaker is face down), this inference of ambient temperature is not accomplished. In some embodiments, motion by a motion sensor can indicate an activity of a speaker, microphone, and/or electronic device in which the speaker and microphone. For example, the activity can be swinging in an arc (such as in the hand of a runner), on the person of a walker (as determined by step motion), or on the person of a runner (as determined by step motion). Responsive to the speaker, microphone, and/or electronic device being within the permitted activity (such as by not swinging in an arc (or else not swinging too fast), not being on the person of a walker (or else the walker is not running too fast), not being on the person of a runner (or else the runner is not running too fast)) the inference of the ambient temperature of the atmosphere through which the acoustic signal traveled is accomplished based on the relationship between the time delay and temperature for the acoustic signal over the third distance. When the activity is determined to be outside of the activity envelope, this inference of ambient temperature is not accomplished. Use of such envelopes helps to prevent situations or conditions which may interfere with acoustic inference of temperature due to excess velocity, orientation which might muffle the acoustic signal, or activity which might cause wind or other acoustic interference in a microphone.

In some embodiments, electronic device 100 and/or sensor processing unit 120 may include a temperature sensor (e.g., temperature sensor 115 and/or temperature sensor 180). In some embodiments, measurements from such temperature sensor(s) may be utilized to calibrate acoustically inferred temperatures. In other embodiments, temperature measurements from one or more of these temperature sensors may be combined, such as averaged, with acoustically inferred temperatures. In some embodiments, acoustical inference of ambient atmospheric temperature is only performed when a reading from a temperature sensor (e.g., 115 and/or 180) is within a defined range. One example of such a defined range is between −15 and 60 degrees Celsius. Other ranges are anticipated and possible.

In some embodiments, an acoustically inferred temperature, may be output for use by an application or component of electronic device 100. In some embodiments, an acoustically inferred temperature may be stored. In some embodiments, an acoustically determined temperature may be output to a user, such by being displayed on display 114 and/or audibly enunciated via speaker 116. Although, inferred temperatures were described herein as being inferred in degrees Celsius, they may be inferred in or converted to other scales such as degrees Fahrenheit by one or more components/applications of electronic device 100.

Conclusion

The examples set forth herein were presented in order to best explain, to describe particular applications, and to thereby enable those skilled in the art to make and use embodiments of the described examples. However, those skilled in the art will recognize that the foregoing description and examples have been presented for the purposes of illustration and example only. The description as set forth is not intended to be exhaustive or to limit the embodiments to the precise form disclosed. Rather, the specific features and acts described above are disclosed as example forms of implementing the claims.

Reference throughout this document to "one embodiment," "certain embodiments," "an embodiment," "various embodiments," "some embodiments," or similar term means that a particular feature, structure, or characteristic described in connection with the embodiment is included in at least one embodiment. Thus, the appearances of such phrases in various places throughout this specification are not necessarily all referring to the same embodiment. Furthermore, the particular features, structures, or characteristics of any embodiment may be combined in any suitable manner with one or more other features, structures, or characteristics of one or more other embodiments without limitation.

What is claimed is:

1. A method of inferring ambient atmospheric temperature, said method comprising:
    capturing a first sample of an acoustic signal emitted from a speaker of a mobile electronic device with a first microphone of said mobile electronic device, said first microphone spaced a first distance from said speaker;
    capturing a second sample of said acoustic signal with a second microphone of said mobile electronic device spaced a second distance from said speaker, wherein said second distance is greater than said first distance, and wherein a difference between said first distance and said second distance is a known third distance;
    determining a time delay in said acoustic signal between said first sample and said second sample; and
    inferring an ambient temperature of the atmosphere through which said acoustic signal traveled based on a relationship between said time delay and temperature for said acoustic signal over said third distance.

2. The method as recited in claim 1, wherein said inferring an ambient temperature of the atmosphere through which said acoustic signal traveled based on a relationship between said time delay and temperature for said acoustic signal over said third distance comprises:
    inferring said ambient temperature based on accessing a stored predetermined representation of said relationship between said time delay and said temperature for said acoustic signal over said third distance.

3. The method as recited in claim 1, wherein said inferring an ambient temperature of the atmosphere through which said acoustic signal traveled based on a relationship between said time delay and temperature for said acoustic signal over said third distance comprises:
    inferring said ambient temperature of the atmosphere through which said acoustic signal traveled based on a humidity adjusted relationship between said time delay and temperature for said acoustic signal over said third distance.

4. The method as recited in claim 1, wherein said inferring an ambient temperature of the atmosphere through which said acoustic signal traveled based on a relationship between said time delay and temperature for said acoustic signal over said third distance comprises:
    wherein said inferring an ambient temperature of the atmosphere through which said acoustic signal traveled based on a relationship between said time delay and temperature for said acoustic signal over said third distance, wherein said time delay comprises one of a time-of-flight delay and a phase shift.

5. The method as recited in claim 1, wherein said inferring an ambient temperature of the atmosphere through which said acoustic signal traveled based on a relationship between said time delay and temperature for said acoustic signal over said third distance further comprises:
    determining, from data provided by a sensor physically coupled with said speaker, a characteristic of said speaker; and
    responsive to said characteristic being within a predetermined envelope, accomplishing said inferring said ambient temperature of the atmosphere through which said acoustic signal traveled based on said relationship between said time delay and temperature for said acoustic signal over said third distance.

6. A mobile electronic device comprising:
    a processor;
    at least one speaker;

a first microphone spaced a first distance from said speaker;

a second microphone spaced a second distance from said speaker, wherein said second distance is greater than said first distance, and wherein a difference between said first distance and said second distance is a known third distance; and wherein said processor is configured to:
operate said first microphone to capture a first sample of an acoustic signal emitted from said speaker;
operate said second microphone to capture a second sample of said acoustic signal;
determine a time delay in said acoustic signal between said first sample and said second sample; and
infer an ambient temperature of the atmosphere through which said acoustic signal traveled based on a relationship between said time delay and temperature for said acoustic signal over said third distance.

7. The mobile electronic device of claim 6, further comprising:
a memory coupled to said processor, said memory configured with a stored predetermined representation of said relationship between said time delay and said temperature for said acoustic signal over said third distance.

8. The mobile electronic device of claim 6, further comprising:
a sensor coupled with said processor and configured to provide data to said processor, wherein said processor is configured to determine a characteristic of said mobile electronic device from said data, and wherein said processor only accomplishes said inferring said ambient temperature of the atmosphere through which said acoustic signal traveled based on said relationship between said time delay and temperature for said acoustic signal over said third distance in response to said characteristic being within a predetermined envelope.

9. The mobile electronic device of claim 6, further comprising:
a temperature sensor, wherein a temperature reading from said temperature sensor is used to calibrate the inferred ambient temperature.

10. The mobile electronic device of claim 6, further comprising:
a temperature sensor, wherein said inferred ambient temperature is only inferred if a reading from said temperature sensor is within a predefined range.

11. The mobile electronic device of claim 6, wherein said processor is further configured to perform at least one of:
selecting said first microphone and said second microphone from a plurality of at least three microphones.

12. The mobile electronic device of claim 6, wherein said processor is one of a sensor processor of a sensor processing unit disposed in said mobile electronic device and a host processor of said mobile electronic device.

13. The mobile electronic device of claim 6, wherein said third distance falls in a range of distances between 0.10 cm and 25 cm.

14. The mobile electronic device of claim 6, wherein said acoustic signal is one of: a single frequency; a plurality of frequencies; a range of frequencies; a known pattern of frequencies; and a pseudorandom noise code.

15. The mobile electronic device of claim 6, wherein said acoustic signal is a repeating waveform with a frequency between 19 kHz and 50 kHz.

16. The mobile electronic device of claim 6, wherein said acoustic signal is a repeating waveform with a frequency between 20 Hz and 21 kHz.

17. The mobile electronic device of claim 6, wherein said time delay comprises one of a time-of-flight delay and a phase shift.

18. A mobile electronic device comprising:
a host processor;
at least one speaker; and
a sensor processing unit comprising:
a first microphone spaced a first distance from said speaker; and
a second microphone spaced a second distance from said speaker, wherein said second distance is greater than said first distance, and wherein a difference between said first distance and said second distance is a known third distance;
wherein said sensor processing unit is configured to:
operate said first microphone to capture a first sample of an acoustic signal emitted from said speaker;
operate said second microphone to capture a second sample of said acoustic signal;
determine a time delay in said acoustic signal between said first sample and said second sample; and
infer an ambient temperature of the atmosphere through which said acoustic signal traveled based on a relationship between said time delay and temperature for said acoustic signal over said third distance.

19. The mobile electronic device of claim 18, further comprising:
a memory coupled to said processor, said memory configured with a stored predetermined representation of said relationship between said time delay and said temperature for said acoustic signal over said third distance.

20. The mobile electronic device of claim 18, further comprising:
a display configured to display said inferred ambient temperature.

21. The mobile electronic device of claim 18, further comprising:
a sensor coupled with said processor and configured to provide data to said processor, wherein said processor is configured to determine a characteristic of said mobile electronic device from said data, and wherein said processor only accomplishes said inferring said ambient temperature of the atmosphere through which said acoustic signal traveled based on said relationship between said time delay and temperature for said acoustic signal over said third distance in response to said characteristic being within a predetermined envelope.

22. The mobile electronic device of claim 18, wherein said processor is further configured to perform at least one of:
selecting said first microphone and said second microphone from a plurality of at least three microphones.

23. The mobile electronic device of claim 18, wherein said third distance falls in a range of distances between 0.10 cm and 25 cm.

24. The mobile electronic device of claim 18, wherein said acoustic signal is one of: a single frequency; a plurality of frequencies; a range of frequencies; a known pattern of frequencies; and a pseudorandom noise code.

25. The mobile electronic device of claim 18, wherein said acoustic signal is a repeating waveform with a frequency between 19 kHz and 50 kHz.

26. The mobile electronic device of claim 18, wherein said acoustic signal is a repeating waveform with a frequency between 20 Hz and 21 kHz.

27. The mobile electronic device of claim 18, wherein said time delay comprises one of a time-of-flight delay and a phase shift.

* * * * *